United States Patent [19]

Davies et al.

[11] Patent Number: 4,675,086
[45] Date of Patent: Jun. 23, 1987

[54] METHOD AND APPARATUS FOR ETCHING INTEGRATED OPTOELECTRONIC DEVICES

[75] Inventors: Graham J. Davies; Charles R. Elliott, both of Woodbridge, England

[73] Assignee: British Telecommunications public limited company, United Kingdom

[21] Appl. No.: 799,253

[22] Filed: Nov. 18, 1985

[30] Foreign Application Priority Data

Nov. 23, 1984 [GB] United Kingdom ................. 8429701

[51] Int. Cl.⁴ ........................... C25F 3/12; C25F 7/00
[52] U.S. Cl. ............................ 204/129.3; 204/129.65; 204/224 M
[58] Field of Search ............ 204/129.3, 129.65, 224 M

[56] References Cited

U.S. PATENT DOCUMENTS

| 4,303,482 | 12/1981 | Bühne et al. | 204/224 M X |
| 4,391,683 | 7/1983 | Buckley et al. | 204/129.65 |
| 4,415,414 | 11/1983 | Burton et al. | 204/129.3 |
| 4,482,443 | 11/1984 | Bacon et al. | 204/129.3 |
| 4,576,691 | 3/1986 | Kohl et al. | 204/129.3 |

Primary Examiner—Donald R. Valentine
Attorney, Agent, or Firm—Nixon & Vanderhye

[57] ABSTRACT

Optoelectronic devices are produced as integrated chips which include elements to control optical signals and electronic elements to control the optical elements. An integrated chip includes optical wave guides with tapered ends to facilitate exit and entry of optical signals. The tapered ends are produced by photo-electrolytic etch using illumination of graded intensity, e.g. the penumbra of a shadow.

13 Claims, 4 Drawing Figures

METHOD AND APPARATUS FOR ETCHING INTEGRATED OPTOELECTRONIC DEVICES

FIELD OF THE INVENTION

This invention relates to integrated optoelectronic devices and in particular to the production of integrated devices which are suitable for processing telecommunications and other signals.

BACKGROUND OF THE INVENTION

The use of optical frequencies for the transmission of telecommunications signals has resulted in the development of many active components which operate at optical frequencies. Examples of such active components include, optical sources, optical detectors, modulators and switches. Although these components operate on optical signals, they are usually controlled electronically. Thus a device which contains one or more of the active elements must also provide paths for the optical (traffic) signals and paths of the electrical control signals.

Thus the complete device performs electronic and optical functions and it is usual to employ the term "optoelectronic devices".

It is particularly desirable to implement optoelectronic devices in integrated forms wherein the paths and the active elements are produced as layers, e.g. by epitaxial deposition and etching. In such structures the optical paths take the form of suitably configured strips of transmissive material, e.g. indium phosphide and gallium arsenide. It is, of course, necessary to couple the paths to the active devices and it has been established that tapered configurations are particularly effective for coupling an optical path to an active device. It will be appreciated that the tapers need to be accurately located and dimensioned. It is an object of this invention to facilitate the production of such tapers.

It is well established to produce optical paths by irradiation controlled electrolytic etching. A paper by Bell Laboratories describes the production of lenses by such techniques and it states that arbitrary features can be produced by appropriate light patterns. U.S. Pat. No. 4,415,414 describes the use of masks consisting of alternate opaque and clear rings to produce lenses.

SUMMARY OF THE INVENTION

According to this invention radiation including a penumbra is applied to the transmissive layer during etching whereby the graded intensity in the penumbra controls the rate of etching to produce a taper.

The method described above is capable of producing a wide range of tapers, e.g. tapers which extend 5 to 1000 times the thickness of transmissive layers. In most applications the taper extends 20 to 150 times, especially 60 to 70 times, the said thickness. The thickness is usually between 2 to 10 $\mu$m, e.g. 3 $\mu$m. During the use of the method the penumbra is adjusted to extend over the region where the taper is required.

The invention also includes apparatus for performing the method using a source of radiation and a screen outside the electrolytic cell. The screen is between the source and the cell in order to produce the penumbra.

BRIEF DESCRIPTION OF THE DRAWINGS

The invention will now be described by way of example with reference to the accompanying drawings in which.

DETAILED DESCRIPTION OF THE DRAWINGS

Figure 1:
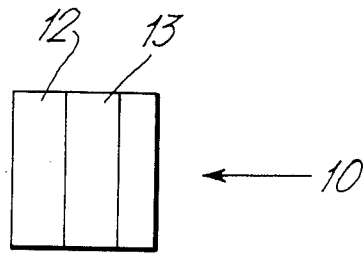
FIG. 1 is a diagrammatic illustration showing a tapered layer having a path with a taper.
Figure 2:
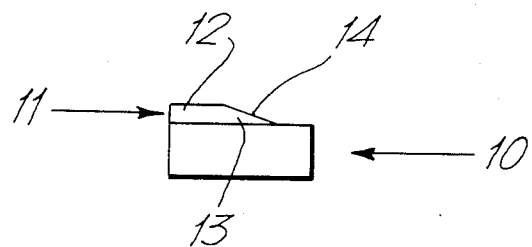
FIG. 2 is a cross section perpendicular to FIG. 1.

FIGS. 1 and 2 illustrate a partially completed device, generally indicated by numeral 10, wherein the finished device includes optical wave guide paths. At the stage shown in FIGS. 1 and 2, the device has a transmissive layer, generally indicated by number 11, which has a uniform section 12 and a tapered section 13 with an exit face 14. The uniform section 12 is 9 $\mu$m thick and the tapered section 13 tapers to 3 $\mu$m over a distance of 200 $\mu$m. Thus the angle of taper (which is exaggerated in the drawings) is about 1° of arc. The process of the invention produces the configuration shown in FIGS. 1 and 2 from a complete transmissive layer 11 uniform over the whole surface.

Figure 3:
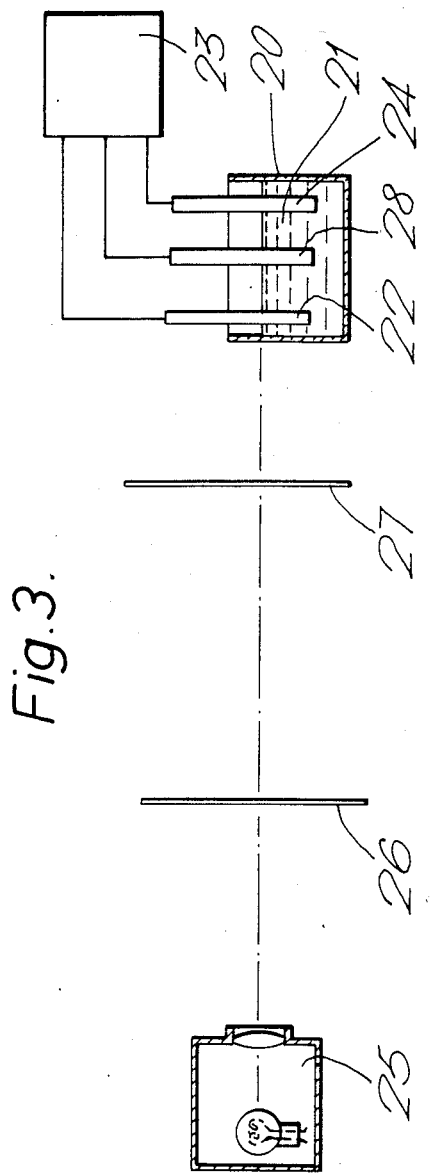
FIGS. 3 and 4 are diagrams illustrating the method of the invention.
Figure 4:
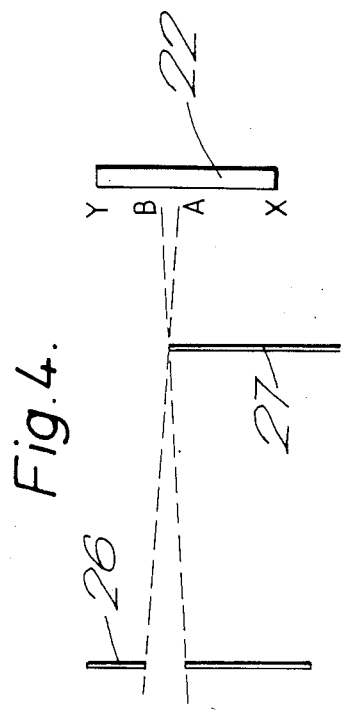

As illustrated in FIGS. 3 and 4 an electrolytic etch is carried out in a glass vessel 20 which contains an aqueous electrolyte 21 and the necessary electrodes. (As is conventional, aqueous solutions of ammonium hydroxide and ammonium tartrate are used to etch indium phosphide, gallium indium arsenide phosphide and gallium indium arsenide.) Three electrodes are used namely the device 22 to be etched which is connected as anode (also referenced as 22), a graphite rod which is connected as cathode 24 and (for control) a calomel reference electrode 28 is also included in the cell.

The anode (i.e. device 22), the calomel electrode 28 and the cathode 24 are connected into a conventional external circuit 23 which provides the power for the electrolysis. (The external circuit 23, which is not separately illustrated, comprises a potentiostat to which the three electrodes 22, 24 and 28 are connected. The potentiostat continually adjusts the electrolysis current so that the anode 22 keeps a pre-set potential relative to the calomel electrode 28 and hence to the electrolyte.)

The electrolysis only proceeds under illumination which is provided by mercury lamp 25 focused on slit 26 (both of which are outside the vessel 20). Screen 27 is positioned between the lamp 25 and anode 22. The window of vessel 20 is of good quality to keep scattering and distortion of the light to an acceptable level.

The precise arrangement of the slit 26 and screen 27 is an important feature of the invention and this feature is more fully illustrated in FIG. 4. The slit 26 is adjusted to a width of 500 $\mu$m and it is positioned about 5 cm from screen 27 which is about 2.5 cm from anode 22. The arrangement is such that the slit 26 illuminates the anode 22 and the screen 27 casts a shadow. There are three regions, i.e. AX which is in full shadow so that no etching occurs, BY which is in full illumination so that rapid etching occurs and AB which is a penumbra with graded intensity of illumination. Thus the rate of etch is slow at A increasing to fast at B whereby a taper is produced. It will be noticed that AB is half the width of the slit, i.e. 200 $\mu$m.

In general terms (using U for the distance between slit 26 and screen 27, V for the distance between screen 27 and anode 22, S for the width of the slit and P for the length of the penumbra):

$$P = (V/U)S$$

Since it is simple to adjust U, V and S over a wide range of values, P is equally adjustable. It will also be appreciated that P represents length of the taper produced by the etching.

This simple theory takes no account of diffraction which may be a defect at the relevant dimensions. An alternative formula, which assumes that the slit is a line source of zero width, i.e. it assumes S=0, gives:

$$Q = [(V/U)(V+U)\lambda]^{0.5}$$

where U and V are as defined above, λ is the wave length of the radiation and Q is the penumbra width by this formula, i.e. a penumbra caused entirely by diffraction.

The table below compares calculated values by the two formulae with measurements, represented by M, based on etched tapers.

|  | A | B | C |
| --- | --- | --- | --- |
| S (μm) | 500 | 500 | 500 |
| U (cm) | 5 | 5 | 6 |
| V (cm) | 5 | 2 | 1.8 |
| λ (nm) | 436 | 436 | 436 |
| P (μm) | 500 | 200 | 150 |
| Q (μm) | 210 | 110 | 101 |
| M (μm) | 250 | 130 | 100 |

(The etched layers were n+ GaAs in the case of experiments A and B and n+ InP in the case of C).

It appears that the simple theory may overestimate the length of the taper. However, it has been observed that the penumbra technique produces a linear taper which curves at both ends. The curves appear to facilitate the coupling. It appears that the Q values (based on refraction) relate to the linear portion of the taper only whereas the curved portions extend beyond both calculated values.

The electrolysis is carried out under conventional conditions, e.g. with the anode 22 at −200 mv relative to the calomel electrode 28. Under these conditions the current is only slightly affected by voltage changes (at higher and lower voltages a small change of voltage causes a large change of current. Such conditions should be avoided.)

The positions of the slit 26 and the screen 27 are easily adjusted by visual inspection so that the penumbra AB is correctly located. Magnifying viewers may be utilised if necessary. Visual inspection may also be used to confirm that the penumbra has the correct width. Measurements of the taper on a finished product can also be used to confirm correct adjustment of the slit and screen.

It will be appreciated that the method of the invention is a convenient way of obtaining the configuration illustrated in FIGS. 1 and 2. Further (conventional) processing is then used to obtain a completed device. During this further processing photoresists may be used to modify the basic configuration shown in FIG. 1. For example portions of the layer 11 may be removed to give a plurality of parallel paths. Also active elements may be produced in contact with exit surface 14.

During use of the finished device optical signals are conveyed in layer 11. These signals meet the exit surface 14 at angles of incidence which facilitate transfer to the elements in contact therewith.

We claim:

1. A method of etching optically transmissive layers in optoelectronic devices using radiation-initiated electrolysis as the etching technique, comprising the steps of:
   (a) placing an aqueous electrolyte in a vessel to establish conditions necessary for electrolytic etching;
   (b) connecting a plurality of electrodes in the vessel to a circuit providing power for electrolysis and connecting the device to be etched to one of said electrodes;
   (c) applying radiation to an optically transmissive layer of the device to initiate etching; said applying radiation step including:
      controlling the intensity of the radiation to produce a penumbra on the transmissive layer having a graded intensity gradually increasing from a low intensity at a first point to a higher intensity at a second point; and
   (d) etching the transmissive layer at gradually increasing rates to produce a taper in the transmissive layer between the first and second points.

2. A method according to claim 1, wherein the length of penumbra on the surface of the transmissive layer is 5 to 1000 times the thickness of said layer.

3. A method according to claim 2, wherein the length of the penumbra is 20 to 150 times the thickness of the layer.

4. A method according to claim 1, wherein the applying the radiation step further includes:
   locating a slit between a source of radiation and the vessel,
   locating a screen between the slit and vessel, whereby the screen produces the penumbra on the transmissive layer of the device to be etched.

5. A method according to claim 4 wherein said screen has an edge directly in the path of the radiation transmitted from the source to the device.

6. A method according to claim 4 wherein said slit has a width on the order of 500 um and is position about 5 cm from the screen which is positioned about 2.5 cm from the device.

7. A method according to claim 4 wherein the length of the taper produced is about one half the width of the slit.

8. Apparatus for etching layers in a device using radiation-initiated electrolysis as the etching technique, said apparatus comprising:
   (a) a cell for performing the electrolytic etch, including an aqueous electrolyte, a plurality of electrodes and a circuit connected to said plurality of electrodes for providing power for electrolysis;
   (b) a device to be etched attached to one of said electrodes;
   (c) a source of radiation; and
   (d) means for applying the radiation to the device to initiate etching; said means for applying radiation including means for controlling the intensity of the radiation to produce a penumbra on the device having a graded intensity gradually increasing from a low intensity at a first point to a higher intensity at a second point; said means for controlling including a screen whereby gradually increasing etching rates between said first and second points of said penumbra produce a taper in the device, and wherein said screen is located outside the cell and between the source and the cell.

9. Apparatus according to claim 8, wherein the source comprises a slit and the screen has an edge parallel to the slit.

10. Apparatus for etching optically active transmissive layers of optoelectronic devices using radiation-initiated electrolysis as the etching technique to produce a taper, wherein said apparatus comprises:
(a) a cell for performing the electrolysis including an aqueous electrolyte, a plurality of electrodes, a circuit connected to said plurality of electrodes for providing power for electrolysis, and a device to be etched attached to one of said electrodes;
(c) a lamp for producing the radiation;
(d) a slit located between the lamp and the cell whereby the slit constitutes the source of the radiation;
(d) means for applying radiation to an optically transmissive layer of the device to initiate etching; said means for applying radiation including:
means for controlling the intensity of the radiation to produce a shadow on the transmissive layer having a graded intensity gradually increasing from a low intensity at a first point to a higher intensity at a second point;
said means for controlling the intensity comprising a screen located between the slit and the cell, wherein the screen casts a shadow on the device to be etched and whereby gradually increasing etching rates between said first and second points of said shadow produce the taper.

11. Apparatus according to claim 10, wherein said screen has an edge directly in the path of the radiation transmitted from the source to the device.

12. Apparatus according to claim 10 wherein said slit has a width on the order of 500 um and is positioned about 5 cm from the screen which is positioned about 2.5 cm from the device.

13. Apparatus according to claim 10 wherein the length of the taper produced is about one half the width of the slit.

* * * * *